United States Patent [19]

Campillo et al.

[11] 4,255,853

[45] Mar. 17, 1981

[54] METHOD FOR INTERCONNECTING THE TERMINALS OF ELECTRICAL ASSEMBLIES

[75] Inventors: Louis Campillo, Domene; Gerard Nicolas, Voreppe, both of France

[73] Assignee: Commissariat a l'Energie Atomique, Paris, France

[21] Appl. No.: 31,836

[22] Filed: Apr. 20, 1979

[30] Foreign Application Priority Data

Apr. 28, 1978 [FR] France .................. 78 12698

[51] Int. Cl.³ ............ H01B 7/08; H01R 11/06
[52] U.S. Cl. .............................. 29/843; 29/850; 174/117 F; 339/28
[58] Field of Search ............ 339/17F, 28, 29 R; 29/628, 629, 630 A, 843, 850; 174/117 F, 117 FF

[56] References Cited

U.S. PATENT DOCUMENTS

| | | | |
|---|---|---|---|
| 3,315,133 | 4/1967 | Walker | 29/628 |
| 3,389,461 | 6/1968 | Hardardt | 29/629 |
| 4,000,558 | 1/1977 | Cahill | 29/625 |
| 4,130,934 | 12/1978 | Asick et al. | 29/628 |

OTHER PUBLICATIONS

IBM Tech. Discl. Bulletin, Hopkins et al., vol. 20, No. 9, p. 3379, 2-1978.

Primary Examiner—Neil Abrams
Attorney, Agent, or Firm—Pearne, Gordon, Sessions, McCoy & Granger

[57] ABSTRACT

At least one slot is formed in one or both connecting end-portions of a flexible insulating support, the slot or slots being superposed on the terminals of the corresponding electrical assembly. Connecting leads are unwound and bonded to the flexible support in the form of a continuous conductor arranged as a snaked coil, the ends of the loops which are placed beyond the slots being then cut off and removed. The method of interconnection permits the achievement of a high connection density, the connecting terminal pitch being of the order of a few tenths of a millimeter.

5 Claims, 4 Drawing Figures

METHOD FOR INTERCONNECTING THE TERMINALS OF ELECTRICAL ASSEMBLIES

This invention relates to a method for interconnecting the terminals of electrical assemblies.

In more precise terms, the present invention is directed to a method for joining the input or output terminals of two electrical devices A and B by means of electrical connections, irrespective of the arrangement of these two assemblies with respect to each other and irrespective of the spacing between the different contacts of said terminals.

It is known that, in the field of electric or electronic circuits, the problem of joining two assemblies A and B by means of electrical connections frequently arises. As a general rule, the assembly A is provided, for example, with one output connector and the assembly B is provided with one input connector. Each connector has n terminals and an electric conductor is intended to be employed for joining each terminal of the output connector of the assembly A to the corresponding terminal of the input connector of the device B. Taking into consideration the development trends in electric circuits and especially electronic circuits, particularly in regard to their increase in density, the different terminals of a connector of this type at the output of an electric or electronic assembly are very closely spaced. The spacing between two adjacent terminals will be designated by the term "pitch" throughout the following description. Should this pitch be of small value (less than one millimeter, for example), the usual interconnection techniques are no longer applicable by reason of the density of connections to be made.

In order to establish these connections, it is a well-known practice in the case of electronic circuits to employ printed circuits having a high conductor-line density, said circuits being deposited and etched on flexible substrates. The disadvantages of these printed circuits are well known, especially when these connections have a high implantation density. Among the problems which can be mentioned are those of insulation and cutoff at the time of etching of said electrical connections.

In order to form these interconnections, it is also a known practice to make use of flexible supports which are sometimes designated as "multilead links". On these interconnection assemblies, the leads are of either circular, flat or rectangular section and uniformly spaced with respect to each other either in single wires or in groups of wires. Said leads are coated with plastic insulating material in order to constitute the desired flat cable. The use of these products does not provide a solution to cases of connection in which the distances between leads are smaller than 1.27 mm. Moreover, multilead links are usually adapted to standard components known as connectors and comprising mechanical male and female portions.

The problems presented by "multilead links" can be summarized by stating that commercially available multilead links serve to join one connector to another connector.

The precise aim of the present invention is to provide a method of interconnection of two electrical assemblies each having n input or ouput lead terminals. This method makes it possible to obtain a high connection density and is suitable for use in particular when the pitch between the different connecting terminals is very small, for example of the order of a few tenths of a millimeter.

The method for connecting two assemblies each having n connecting terminals by means of conducting connections, the connecting terminals of at least one of said assemblies being designed in the form of conducting zones located at the level of the external surface of the assembly support, is distinguished by the fact that said method consists:

in defining a flexible insulating support having two connecting end-portions and a central portion, at least one slot being formed in at least one of said connecting end-portions, said slot or slots being intended to be superposed on the terminals of the corresponding assembly, said flexible support being provided with at least one extension located beyond said slot or each slot aforesaid with respect to said central portion;

in unwinding n electrical connecting leads and in bonding said leads to said flexible support including said extension or extensions, one end of each connecting lead being thus placed above a slot opposite to the terminal to which said lead is intended to be connected;

in establishing an electrical contact between each end of the connecting leads and in suppressing said extension or extensions, said ends of the flexible support being then bonded to said assemblies in accordance with a further step of said method.

In a first mode of execution which is primarily suited to the case in which the pitch between terminals is larger than 0.5 mm approximately, said electrical connecting leads are bonded to said flexible support, whereupon the ends of said flexible support are bonded to the assembly supports.

In accordance with a second mode of execution which is primarily suited to the reverse case, said ends of the flexible support are bonded to the assembly supports so as to ensure that said slot or slots are placed opposite to said terminals, whereupon said electrical connecting leads are bonded to said flexible support.

However, it is apparent that, at the end of the method according to the invention and in both cases outlined in the foregoing, the ends of the flexible support are bonded to the two assemblies to be joined together electrically.

A more complete understanding of the invention will in any case be gained from the following description of a number of embodiments of the method in accordance with the invention which are given by way of example and not in any limiting sense, reference being made to the accompanying drawings, wherein.

Figure 1:
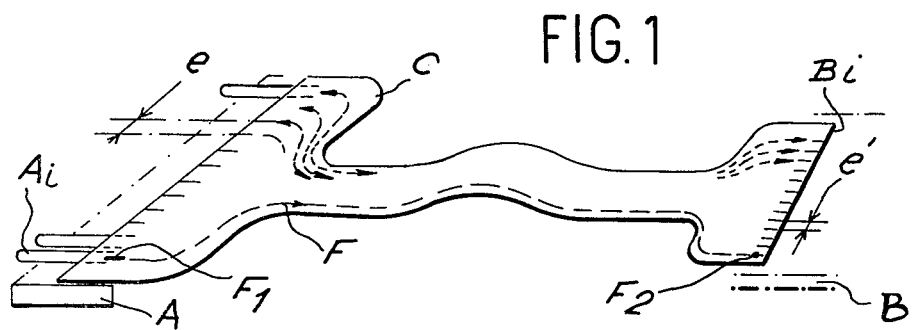
FIG. 1 is a general view showing two electrical assemblies A and B joined together by means of electrical connections, the aim of this figure being to present the problem to be solved.

FIG. 1 shows the type of connection employed in order to carry out the method in accordance with the invention. It is proposed to connect the first circuit A to the second circuit B. The circuit A comprises output terminals $A_i$ which are uniformly disposed with a pitch e. Similarly, the second circuit B comprises input terminals $B_i$ which are uniformly disposed with a pitch e'. By means of the method in accordance with the invention, a connection can be established between a terminal $A_i$ of the circuit A and the corresponding terminal $B_i$ of the circuit B. The complete set of connections is constituted by a flexible insulating support C and by leads F which may or may not be insulated and are bonded to said support by gluing. A first end $F_1$ of each lead F is connected to a terminal $A_i$ of the assembly A and the second end $F_2$ of the same lead is connected to the terminal $B_i$ of the assembly B. The flexible insulating plate C has the general shape of a convergent-divergent element. The end portions of the plate C are bonded to the support plates of the electrical assemblies A and B. A connection is thus formed between the assemblies A and B.

Having thus defined the result which can be achieved by means of the method in accordance with the invention, the different steps of a preferred mode of execution of the method will now be described in detail in the case in which the smallest pitch between the connecting terminals is larger than 0.5 mm.

A first step consists in cutting-out a flexible and insulating support 2 having a first connecting end-portion 2a and a second connecting end-portion 2b, said end-portions being joined together by a portion 2c of smaller width. The connecting end-portion 2a is provided with a slot 4a having a generally rectangular shape and dimensions such as to extend over all the connecting terminals of the electrical assembly A, it being assumed that said terminals are in alignment. Similarly, the connecting end-portion 2b is provided with a slot having a generally rectangular shape 4b and so arranged as to cover all the connecting terminals of the electrical assembly B, it being also assumed in this case that said terminals are aligned. It is apparent that, with respect to the central portion 2c of the flexible support 2, the slots 4a and 4b define extensions 7b and 7a which are joined to the remainder of the support by means of tabs surrounding the slots. In a second step, a conductor wire or lead 6 is unwound and bonded continuously to the flexible support 2. It is clearly ensured that said lead has the desired cross-section and may or may not be insulated according to the density of the connections formed. Bonding of said lead 6 to the flexible insulating support 2 is performed by means of a programmed machine which is identical with the machine described in French Pat. No. 2,185,915 filed in the name of the present Applicant. The lead forms a continuous snaked coil and is provided with portions such as the portion 6a which are intended to constitute the final electrical connections and with loops 6b and 6'a which are located respectively beyond the slots 4a and 4b, said loops being thus bonded to the extensions 7a and 7b by gluing. By virtue of the fact that the lead is bonded on each side of each slot, the bonding operation is carried out without any difficulty and those portions of the lead which are located above the slots 4a and 4b are thus positioned with a high degree of accuracy. In other words, the continuous lead 6 has a first extremity 8 which, in the example herein described, is bonded to the extension 7a of the extremity of the connecting end-portion 2a and a second extremity 10 which is bonded to the extension 7b of the extremity of the connecting end-portion 2b. Depending on the density of connection which is necessary, the lead 6 may or may not be insulated. In the event of insulation of the lead 6, the machine carries out baring of the lead wire opposite to the slots 4a and 4b in addition to the operation which consists in bonding said lead 6 to the flexible support 2.

On completion of the structure constituted by the flexible support 2 and the continuous lead 6, this assembly is then placed on the circuit elements to be assembled (again designated by the references A and B).

Figure 2:
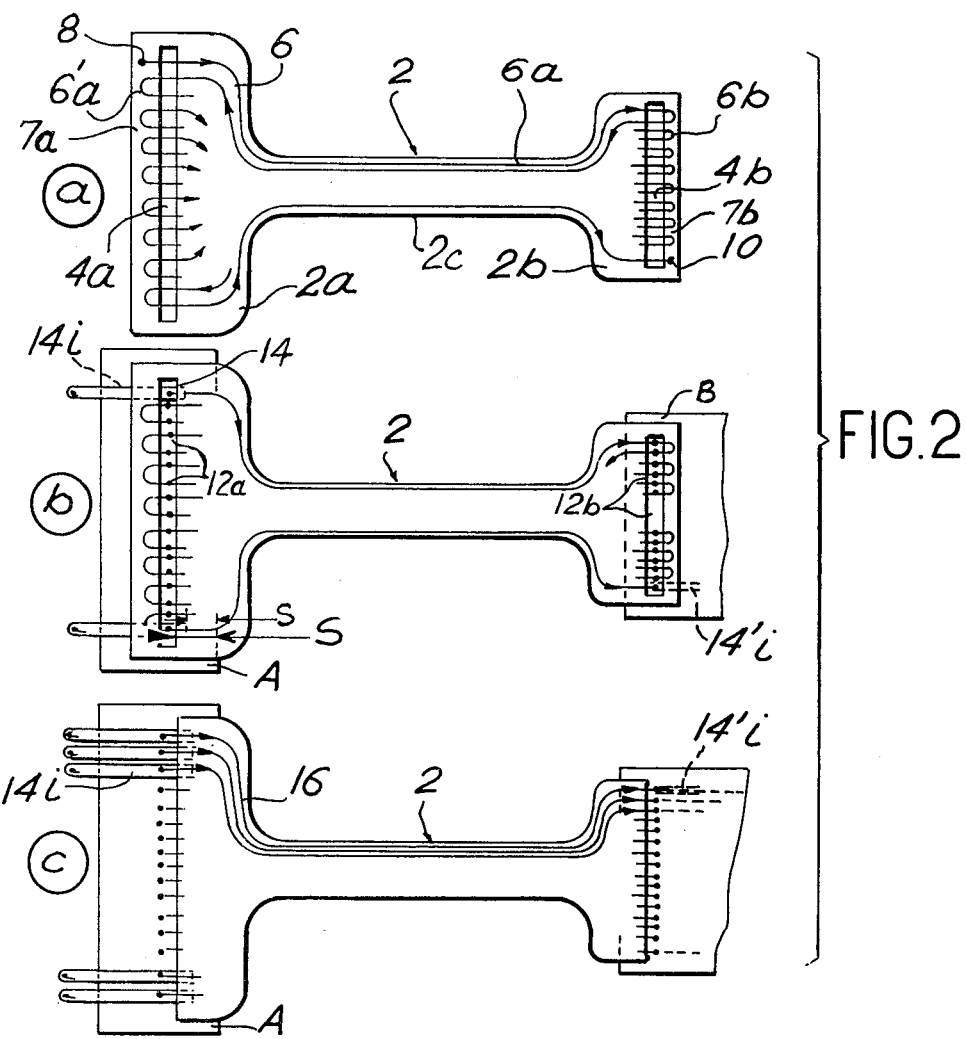
FIG. 2 shows the different steps of the method of connection according to the invention in the case in which the pitch of the connecting terminals is larger than 0.5 mm.

The electrical assemblies A and B are positioned with the correct spacing. The flexible support 2 is then superposed on said assemblies A and B in such a manner as to ensure that the connecting terminals 12a of the circuit A and 12b of the circuit B are located opposite to the different meanders of the lead wire 6 and that said terminals are located beneath the slots 4. The flexible support 2 is bonded to the supports of the electrical assemblies A and B over a width s in such a manner as to ensure that the slots 4a and 4b are substantially adjacent to the bonding zone which has a thickness s. In a second step, n points of electrical contact such as the point 14 are formed in a second step and establish an electrical connection on the one hand between each terminal 12a and each of the portions of lead wire 6 which are located above the slot 4a and on the other hand between the terminals 12d and the portions of lead wire which are located above the slot 4b. It is apparent in the first place that, as a result of this operation, the flexible support 2 has been joined to the supports corresponding to the circuit A and to the circuit B and that, in the second place, and electrical connection has been established between the terminals 12a and 12b and the different electrical connections made on the flexible support 2. A final step consists on the one hand in cutting away the flexible support extensions 7a and 7b defining the slots 4a and 4b and on the other hand in cutting the loops 6'a and 6b of the continuous lead wire 6 beyond the points of electrical contact. As shown in FIG. 2c, there is thus obtained a succession of connecting wires 16 which join a terminal $14_i$ of the circuit A to the terminal $14'_i$ of the circuit B. Taking into account the fact that the support 2 is flexible, it can also be understood that there is no need to place the circuits A and B in the same plane. It is further apparent that bonding of the lead wire to the flexible support 2 can readily be performed by placing a continuous lead 6 in position, said lead being divided into a convergent-divergent bundle of individual conductors 16 only in a subsequent step by cutting the loops 6'a and 6b and the ends of the flexible support 2. It is readily apparent that each electrical connecting lead 16 could be bonded by gluing in succession.

Figures 3, 4:
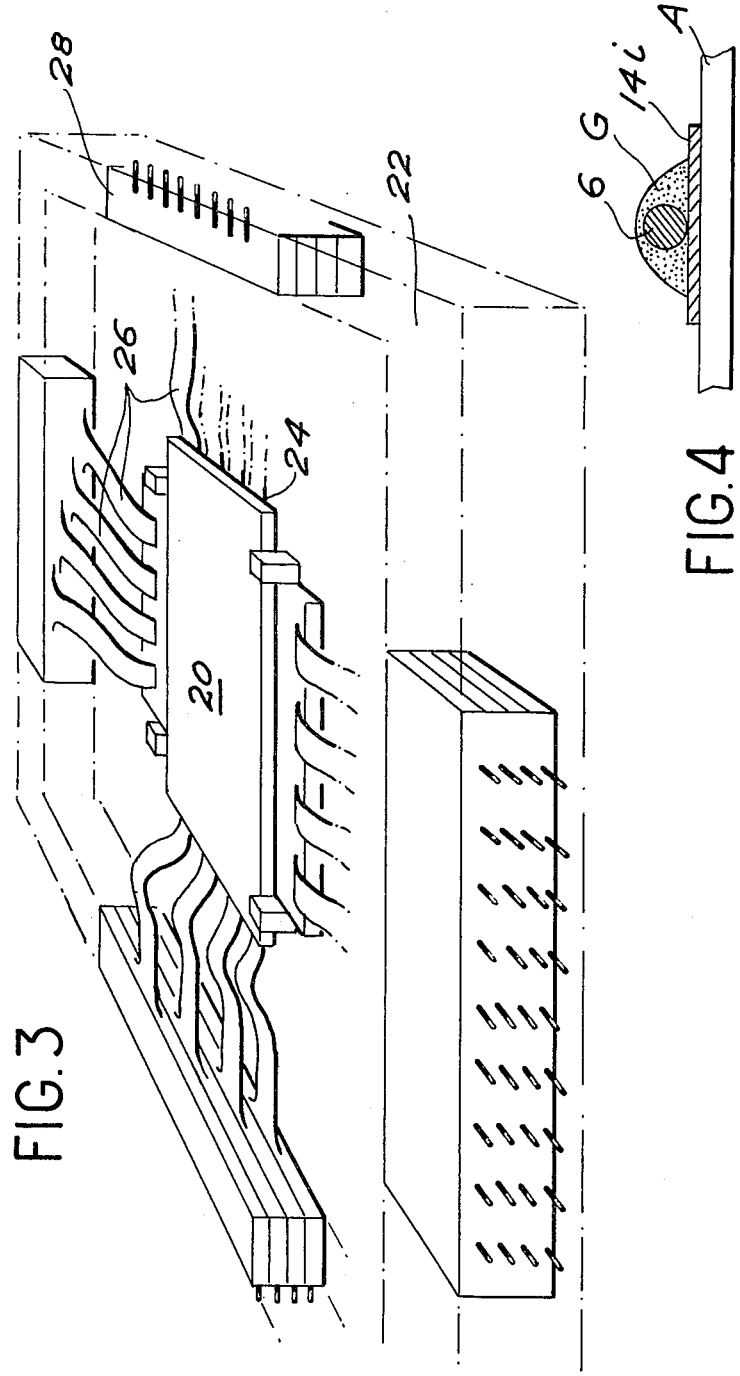
FIG. 3 shows one example of utilization of the method of connection in the case of a liquid crystal imaging device.
FIG. 4 is a cross-sectional view showing the bond between a conductor wire or lead and a connector terminal.

In FIG. 4, there is shown one mode of execution of the bond between a terminal $14_i$ and a lead wire 6. The wire 6 which has been first stripped and placed above the terminal $14_i$ as a result of the steps described in the foregoing, there is then deposited a drop G of an epoxy resin filled with conductive material. The drop G preferably surrounds the lead 6 and establishes the electrical connection between the lead and the terminal $14_i$. The means for carrying out this method of connection are well known and described in particular in the review entitled "Electronic design" No 20, Sept. 27th, 1975, pages 82 to 85.

In the event that the pitch between the terminals of the circuits A and B is smaller than 0.4 mm, practically insuperable problems are encountered in regard to positioning of the assembly shown in FIG. 2a on the connecting terminals of the electrical assemblies A and B. In this type of connection, the flexible support 2 without its lead wire 6 is bonded to the electrical assemblies A and B prior to bonding of said lead wire. In other words, the situation shown in FIG. 2b is found to be the same, apart from the fact that the flexible support 2 is not yet fitted with the lead wire. In this mode of execution, bonding of the lead wire 6 is performed continuously, for example, in the manner which has been explained earlier with reference to FIG. 2a after bonding of the flexible support 2 to the elements A and B and by means of the same machine. When the entire bonding operation has been completed, the next operating step illustrated in FIG. 2c is carried out in exactly the same manner as already described with reference to this figure.

Should the pitch of the terminals of the assemblies A and B be different, it can readily be conceived that the connection with one of these assemblies may present positioning problems whereas the connection with the other assembly does not give rise to any difficulty. As will readily be apparent, it will be possible in this case to adopt an intermediate solution between the two modes of execution described earlier. In other words, the flexible support 2 will be bonded to the electrical or electronic assembly in which the connection pitch is smaller and the other end of the flexible support 2 will be bonded to the second electrical assembly only after bonding of the lead wire.

In FIG. 3, there is shown in perspective one example of practical application of the method according to the invention in the case of construction of the outputs of a liquid crystal imaging device designated by the reference numeral 20. This imaging device is fixed on a supporting table 22 and provided on each of its four sides with output terminals 24. In the example under consideration, provision is made for 256 output terminals having a pitch of 0.2 mm. There are also shown in this figure the connectors 28 which serve to join the different terminals 24 of the imaging device to the electric circuit for processing signals and controlling the state of the different sensitive points of the imaging device. In this particular case, each face of the imager is constituted by four vertically stacked connectors 28 each having 64 channels and a pitch of the order of 2.54 mm. Each connector 28 is joined to the terminals 24 of the imager 22 by means of four flexible support assemblies 26 fitted with lead wires. Connection and positioning of said flexible connection supports with respect to the terminals of the imager is carried out as indicated earlier. Connection with the terminals of the connector is performed in a conventional manner, for example, by soldering onto said terminals the ends of the wire which project from the flexible support. In this particular case, the wire which serves to form the interconnections is insulated.

This example shows that the connection between the two electrical assemblies can be made by means of a plurality of separate flexible supports each comprising a predetermined number of electrical connections.

Said example also shows that the method according to the invention can be applied to only one end of the flexible support for connecting to only one of the assemblies A and B.

The foregoing description of the method in accordance with the invention has been given in the case which is common in practice and in which the terminals of the assemblies to be interconnected are aligned. It is apparent that the invention also applies to the case in which the terminals of at least one of said assemblies are distributed in any predetermined manner over the surface of said assembly. In such a case the rectangular slots 4a or 4b are replaced by a plurality of recesses which have the same geometrical configuration as the terminals to be interconnected and on which the flexible support is intended to be fitted.

We claim:

1. A method for electrically connecting, by means of electrically conducting connections, two assemblies each having n connecting terminals, the connecting terminals of at least one of said assemblies being designed in the form of conducting zones located at the level of the external surface of the assembly support, wherein said method includes the sequential steps of:
   providing at least one flexible insulating support having two connecting end-portions and a central portion, at least one slot being formed in at least one of said connecting end-portions, said slot being arranged to be superposed on the terminals of the corresponding assembly over said conducting zones, said flexible support being provided with at least one extension located beyond said slot with respect to said central portion;
   bonding at least said slotted end-portion of the flexible support to the respective assembly;
   providing n electrical connecting leads and bonding said leads to said flexible support including said extension, at least one end of each connecting lead being placed above said slot opposite to the terminal conducting zone to which said lead is intended to be electrically connected; and
   establishing an electrical contact between each end of the connecting leads and their respective terminal conducting zone.

2. A method as defined in claim 1, wherein the step of providing said n electrical connecting leads includes the step of bonding a continuous conductor wire to the flexible support in the form of a snaked coil, the electrical connections thus established being joined at the ends by loops placed beyond any said slot, said loops being subsequently cut off and removed.

3. A method as defined in claim 1, including stripping the insulation from said leads at said slot location, prior to establishing said electrical contact, when said leads are provided in insulating form.

4. A method as defined in claim 1, including the step of distributing the n electrical connecting leads over a provided plurality of flexible insulating supports, the terminals of one of the assemblies to be connected being distributed over a plurality of subassemblies each connected to one of the flexible insulating supports.

5. A method as defined in claim 1, including the final step of cutting away the extension located beyond the slot with respect to said central portion.

* * * * *